(12) United States Patent
Heerman

(10) Patent No.: US 6,696,665 B2
(45) Date of Patent: Feb. 24, 2004

(54) METHOD FOR INTRODUCING PLATED-THROUGH HOLES INTO AN ELECTRICALLY INSULATING BASE MATERIAL HAVING A METAL LAYER ON EACH SIDE

(75) Inventor: Marcel Heerman, Merelbeke (BE)

(73) Assignee: Siemens Aktiengesellschaft, Munich (DE)

( * ) Notice: Subject to any disclaimer, the term of this patent is extended or adjusted under 35 U.S.C. 154(b) by 310 days.

(21) Appl. No.: 09/954,410

(22) Filed: Sep. 17, 2001

(65) Prior Publication Data
US 2002/0027129 A1 Mar. 7, 2002

Related U.S. Application Data

(63) Continuation of application No. PCT/DE00/00813, filed on Mar. 16, 2000.

(30) Foreign Application Priority Data

Mar. 16, 1999 (DE) .......................................... 199 11 721

(51) Int. Cl.[7] .............................................. B23K 26/36
(52) U.S. Cl. .............................. 219/121.69; 219/121.71
(58) Field of Search ........................ 219/121.6, 121.68, 219/121.69, 121.7, 121.71, 121.85

(56) References Cited

U.S. PATENT DOCUMENTS 3,265,546 A 8/1966 Medford
5,593,606 A 1/1997 Owen et al.
6,346,678 B1 * 2/2002 Kono et al. .................. 174/255

FOREIGN PATENT DOCUMENTS

| CH | 681 758 A5 | 5/1993 |
| DE | 37 32 249 A1 | 4/1989 |
| DE | 41 31 065 A1 | 3/1993 |
| DE | 197 19 700 A1 | 11/1998 |
| EP | 0 062 300 A2 | 10/1982 |
| EP | 0 164 564 A1 | 12/1985 |
| EP | 0 361 192 A2 | 4/1990 |
| EP | 0 757 885 B1 | 2/1997 |

* cited by examiner

Primary Examiner—Samuel M. Heinrich
(74) Attorney, Agent, or Firm—Laurence A. Greenberg; Werner H. Stemer; Ralph E. Locher

(57) ABSTRACT

A method for introducing plated-through holes into an electrically insulating base material includes steps of: providing an electrically insulating base material having a first surface with a first metal layer and a second surface with a second metal layer; applying an etching resist layer at least to the first metal layer; using electromagnetic radiation to remove the etching resist layer and to thereby uncover the first metal layer in regions where plated-through holes are to be produced; etching away the uncovered regions of the first metal layer as far as the first surface of the base material; and using a laser beam to produce the plated-through holes in the base material.

16 Claims, 3 Drawing Sheets

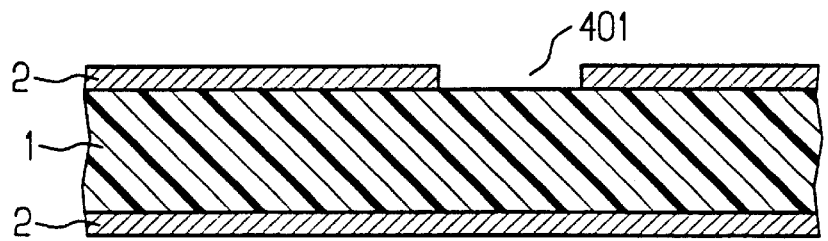
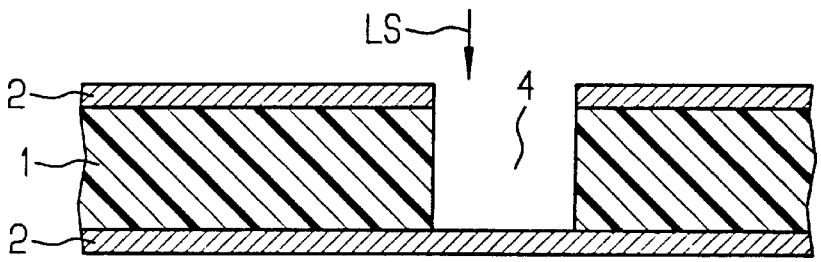
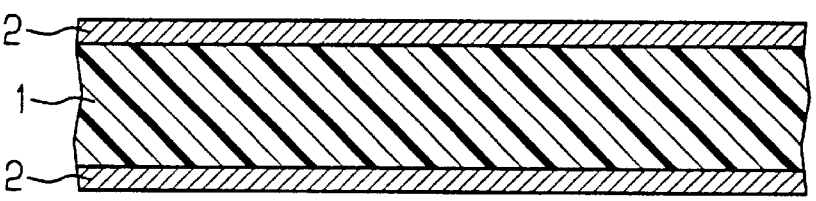
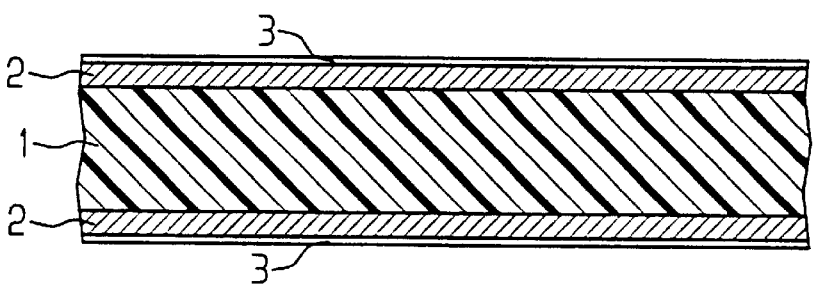

METHOD FOR INTRODUCING PLATED-THROUGH HOLES INTO AN ELECTRICALLY INSULATING BASE MATERIAL HAVING A METAL LAYER ON EACH SIDE

CROSS-REFERENCE TO RELATED APPLICATION

This application is a continuation of copending International Application No. PCT/DE00/00813, filed Mar. 16, 2000, which designated the United States.

BACKGROUND OF THE INVENTION

FIELD OF THE INVENTION

Published European Patent Application EP 0 062 300 A discloses a method for producing printed circuit boards which proceeds from a base material that is coated with copper on both sides. After mechanically boring through holes, a copper-plating layer is applied to the hole walls and to the copper coating by performing chemical and subsequent electrical metal deposition. After the subsequent whole-area application of an etching resist layer, the latter is then selectively removed again with the aid of a laser beam. The desired conductor track pattern can be patterned by etching away the copper layer that is uncovered in this way.

Published European Patent Application EP 0 361 192 A discloses a similar method in which the etching resist layer is removed by first using a laser beam only in the regions directly adjoining the later conductor track pattern. The regions of the copper layer that are uncovered as a result are etched away. In the still remaining, undesired regions of the copper layer that do not correspond to the conductor track pattern, the etching resist is electrolytically removed, whereupon the undesired regions are removed by etching.

U.S. Pat. No. 3,265,546 discloses a method for producing printed circuit boards in which the hole pattern of the later plated-through holes is transferred to the copper coatings by means of phototechnology and is introduced into the copper coatings by a subsequent etching. The uncovered base material in the hole region of the copper coatings is then removed by chemical etching in order to complete the plated-through holes.

Published European Patent Application EP 0 164 564 A discloses a similar method for producing printed circuit boards or intermediate laminates for multilayer printed circuit boards in which, the hole pattern of the later plated-through holes is likewise introduced by means of phototechnology and subsequent etching into a copper coating. Using the copper coating patterned in this way as a mask, the unprotected base material is then removed using a laser beam, the opposite copper coating ending this removal process.

Published Swiss Patent CH 681758 A discloses a method for producing printed circuit boards or intermediate laminates of multilayer printed circuit boards, in which the hole pattern of the later plated-through holes is again introduced by means of phototechnology and subsequent etching into a copper coating or into both copper coatings. Using the copper coatings patterned in this way as etching-resistant hole masks, the plated-through holes are then introduced by plasma etching into the base material.

It is also already known to introduce the hole pattern of the later plated-through holes by using a laser to bore into a metal layer or into both metal layers of a base material that is coated with copper on both sides. Hole patterns with diameters in the micron range are in this way produced using UV (Ultraviolet) lasers or IR (Infrared) lasers. The boring operation is a sequential process, and therefore, also requires a relatively long time. Moreover, during the laser boring process, it is necessary to remove the copper in the region of the holes in a circular or spiral manner in a plurality of layers. During the laser boring of holes with a diameter of 150 $\mu$m or 100 $\mu$m, removal of at most 5 $\mu$m of copper can be achieved per pass depending on the type of laser used. This removal is also limited by the fact that, during the removal process, a plasma is produced above the removal site, which plasma prevents the further introduction of laser energy. Moreover, the last removal step cannot be effected with the same power since the adhesion of the underlying organic base material at the edge of the hole might otherwise be reduced. In the case of a copper layer thickness of 17 $\mu$m, for example, the holes are introduced in four to five processing layers.

SUMMARY OF THE INVENTION

It is accordingly an object of the invention to provide a method for introducing plated-through holes into an electrically insulating base material that is provided with metal layers on both sides which overcomes the above-mentioned disadvantageous of the prior art methods of this general type. In particular, it is an object of the invention to produce the hole patterns in one metal layer or in both metal layers quickly and with low cost and effort.

With the foregoing and other objects in view there is provided, in accordance with the invention, a method for introducing plated-through holes into an electrically insulating base material having surfaces with metal layers. The method includes steps of: providing an electrically insulating base material having a first surface with a first metal layer and a second surface with a second metal layer; applying an etching resist layer at least to the first metal layer; using electromagnetic radiation to remove the etching resist layer and to thereby uncover the first metal layer in regions where plated-through holes are to be produced; etching away the uncovered regions of the first metal layer as far as the first surface of the base material; and using a laser beam to produce the plated-through holes in the base material.

Following the procedure disclosed in Published European Patent Application EP 00 62 300 A for producing conductor track patterns, in the present method, the hole patterns are produced by patterning an etching resist by means of electromagnetic radiation and subsequent etching. In this case, the thin etching resist layer is removed in the region of the later produced plated-through holes by moving the electromagnetic radiation at a high speed in a circular or spiral manner. During the subsequent selective etching process, all of the holes of the hole pattern are then produced simultaneously, which leads to a considerable timesaving by comparison with a sequential boring operation. The plated-through holes are introduced into the base material using a laser beam, thereby completely preventing undercutting of the metal layer.

In accordance with an added feature of the invention, the etching resist layer that is no longer required is completely removed after the etching operation. The base material provided with the plated-through holes can then be treated further for the purpose of completing the printed circuit boards or for the purpose of completing intermediate laminates using the previously employed laser device according to the method disclosed in European Patent application EP 0 062 300 A. The production of the metal layers that are applied to the base material can be performed, for example, by chemical and subsequent electrical metal deposition or by sputtering.

In accordance with an additional feature of the invention, the starting point begins with a base material that is coated with copper on both sides. Such a base material can be produced with a low outlay and has already proved successful for a very long time in printed circuit board technology.

In accordance with a further feature of the invention, when using metallic etching resist layers, patterning by means of electromagnetic radiation leads to very good results.

In accordance with a further added feature of the invention, tin or a tin-lead alloy is used for the etching resist layer. Etching resist layers of this type can, on the one hand, be easily patterned using a laser, for example, while on the other hand they ensure reliable protection of the underlying metal layer during the etching process.

In accordance with a further additional feature of the invention, the metallic etching resist layer is preferably applied by electroless metal deposition, since this can be carried out in a particularly economical manner.

In accordance with another feature of the invention, it is also possible to use an organic material for the etching resist layer.

In accordance with another added feature of the invention, such organic etching resist layers can be applied in a particularly simple manner by electro-dipcoating or by electrostatic coating.

In accordance with another additional feature of the invention, the electromagnetic radiation is preferably generated by a laser, since laser beams are particularly suitable for removal or for vaporization of the etching resist layer in the desired regions.

In accordance with yet an added feature of the invention, the movement of the laser beam relative to the base material should then preferably be freely programmable, in other words a process of describing the contour of the hole pattern can be carried out quickly using the laser beam, and in particular, can also easily be varied.

In accordance with yet an additional feature of the invention, the plated-through holes are introduced into the base material as blind holes that are bounded by a metal layer. Such a procedure is suitable both for the production of printed circuit boards and for the production of intermediate laminates for multilayer printed circuit boards.

In accordance with a concomitant feature of the invention, it is also possible for the plated-through holes to be introduced into the base material as through holes. In the case of this variant, however, both metal layers must then be provided with the corresponding hole pattern of the plated-through holes.

Other features which are considered as characteristic for the invention are set forth in the appended claims.

Although the invention is illustrated and described herein as embodied in a method for introducing plated-through holes into an electrically insulating base material that is provided with metal layers on both sides, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1–6 show, in a greatly simplified diagrammatic illustration, different method stages during the introduction of blind holes into a base material that is provided with a metal layer on each side thereof; and FIGS. 7–12 show, in a greatly simplified diagrammatic illustration, different method stages during the introduction of through holes into a base material that is provided with a metal layer on each side thereof.

DESCRIPTION OF THE PREFERRED EMBODIMENTS

Figure 1:
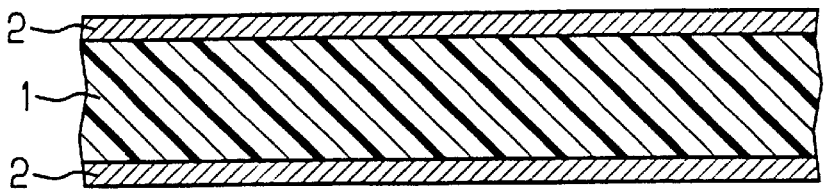

Referring now to the figures of the drawing in detail and first, particularly, to FIG. 1 thereof, there is shown an electrically insulating base material 1 that is provided with a metal layer 2 on each side thereof. In the exemplary embodiment illustrated, the metal layers 2 are copper coatings which, for example, have a thickness of 10 $\mu$m.

Figure 2:
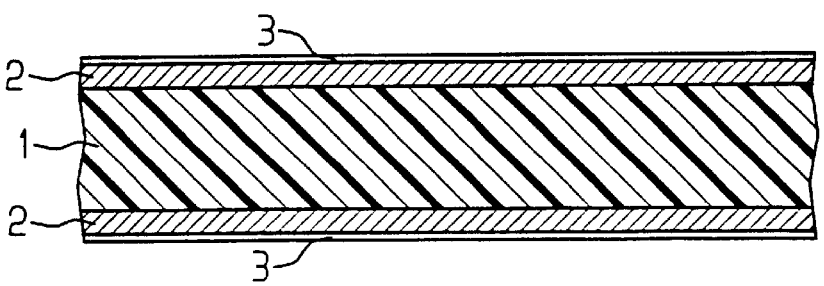

FIG. 2 shows an etching resist layer 3 that has been applied to the metal layers 2. In the exemplary embodiment portrayed, the etching resist layer 3 is produced by electroless deposition of tin with a thickness of 1 $\mu$m, for example.

Figure 3:
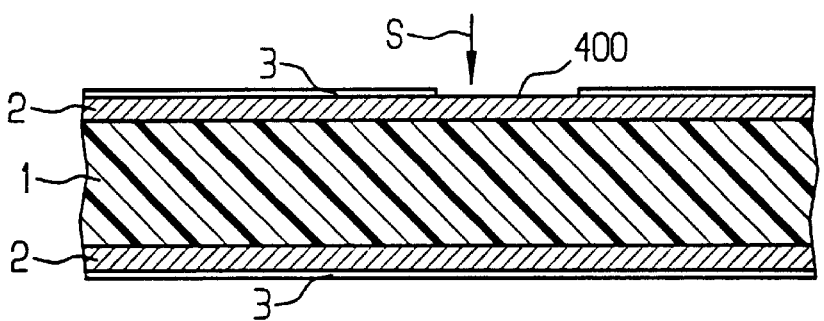

FIG. 3 shows that after the deposition of the etching resist layer 3, electromagnetic radiation S is directed toward the top side of the resist layer 3 in the region 400 of a plated-through hole that is to be produced. The electromagnetic radiation S, indicated by an arrow in FIG. 3, is generated by an Nd:YAG laser in the exemplary embodiment portrayed. In this case, the laser removal is effected in a scan method. Each of the regions 400 of the corresponding hole pattern have a diameter of 100 $\mu$m, for example.

Figure 4:
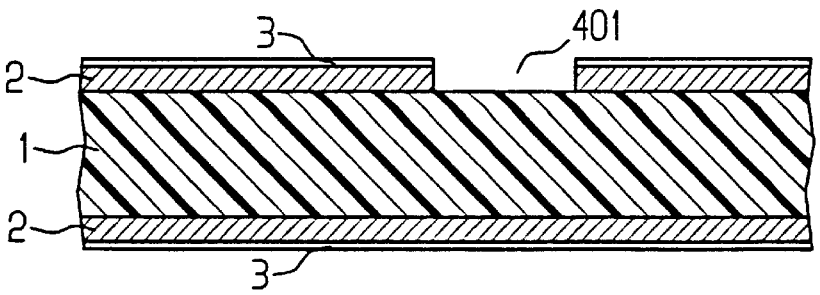

Those regions of the upper metal layer 2 which have been uncovered by the selective laser removal of the etching resist layer 3, as shown in FIG. 3, are then etched away as far as the surface of the base material 1 as shown in FIG. 4. For this purpose, it is possible to use etching solutions that are customary in subtractive technology. One of the holes that are introduced into the metal layer 2 during the etching operation is indicated by a region 401 shown in FIG. 4.

FIG. 5 shows that the etching resist layer 3 is completely stripped after the patterning of the upper metal layer 2.

After stripping the etching resist layer 3, the plated-through holes, designated by 4, are then introduced into the base material 1 as shown in FIG. 6. In the exemplary embodiment illustrated, the plated-through holes 4, designed as blind holes, are produced using laser beams indicated by the arrow LS shown in FIG. 6. In accordance with the procedure disclosed in Published European Patent Application EP 0 164 564 A, the upper patterned metal layer 2 acts as a mask, while the lower metal layer 2 ends the base material removal that is performed using an excimer laser.

FIGS. 7–12 show another embodiment of the method in which FIGS. 7 and 8 correspond to FIGS. 1 and 2 already discussed above.

Figure 9:
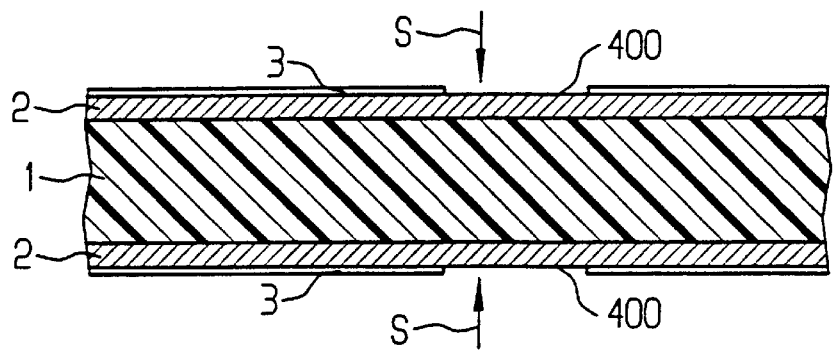
Figure 10:
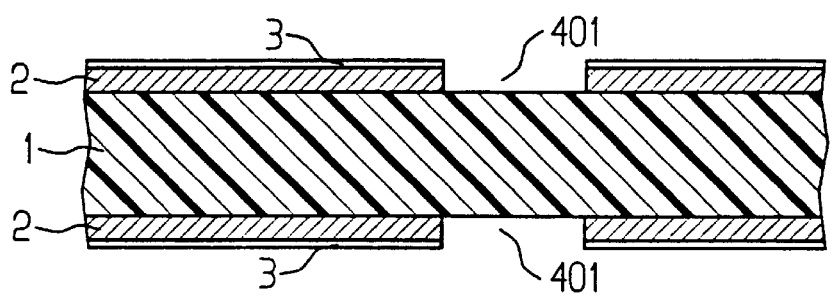

FIG. 9 shows that the etching resist layer 3 is removed using electromagnetic radiation S both on the top side and on the underside in the regions 400 of plated-through holes that are to be produced. The regions of the metal layers 2 that are uncovered in this way are then etched away on the top side and on the underside as far as the surface of the base material 1, as shown in FIG. 10.

Figure 11:
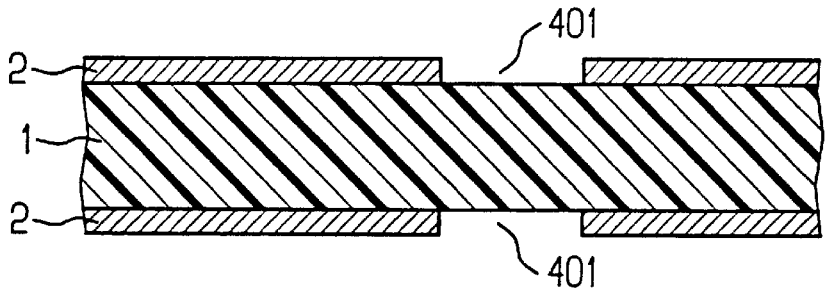
Figure 12:
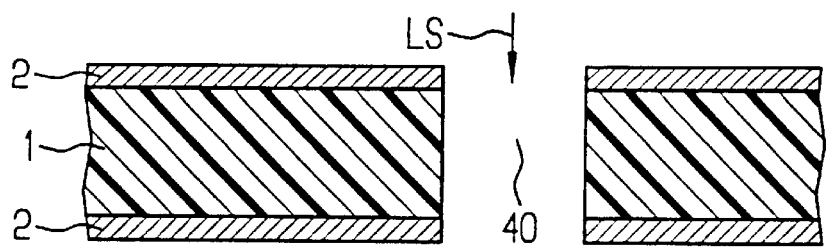

After the etching resist layer 3 has been stripped, as can be seen in FIG. 11, the plated-through holes 40, which are designed as through holes in accordance with FIG. 12, are then introduced into the base material 1. In this case, too, the removal of the base material for the purpose of forming the plated-through holes 40 is again effected using laser radiation, which is indicated by an arrow LS in FIG. 12.

I claim:

1. A method for introducing plated-through holes into an electrically insulating base material having surfaces with metal layers, which comprises:

providing an electrically insulating base material having a first surface with a first metal layer and a second surface with a second metal layer;

applying an etching resist layer at least to the first metal layer;

using electromagnetic radiation to remove the etching resist layer and to thereby uncover the first metal layer in regions where plated-through holes are to be produced;

etching away the uncovered regions of the first metal layer as far as the first surface of the base material; and using a laser beam to produce the plated-through holes in the base material.

2. The method according to claim 1, which comprises, after etching away the uncovered regions of the first metal layer, completely removing the etching resist layer.

3. The method according to claim 2, which comprises:
   providing the first metal layer as a copper layer; and
   providing the second metal layer as a copper layer.

4. The method according to claim 1, which comprises:
   providing the first metal layer as a copper layer; and
   providing the second metal layer as a copper layer.

5. The method according to claim 1, which comprises providing the etching resist layer as a metallic etching resist layer.

6. The method according to claim 5, which comprises performing the step of applying the etching resist layer by performing an electroless metal deposition.

7. The method according to claim 1, which comprises providing the etching resist layer as a metallic etching resist layer that is made of a material selected from the group consisting of tin and a tin-lead alloy.

8. The method according to claim 7, which comprises performing the step of applying the etching resist layer by performing an electroless metal deposition.

9. The method according to claim 1, which comprises providing an organic material as the etching resist layer.

10. The method according to claim 9, which comprises performing the step of applying the etching resist layer by performing a process that is selected from the group consisting of electro-dipcoating and electrostatic coating.

11. The method according to claim 1, which comprises generating the electromagnetic radiation with a laser.

12. The method according to claim 11, which comprises moving the laser beam relative to the base material.

13. The method according to claim 11, which comprises controlling a movement of the laser beam relative to the base material with a program.

14. The method according to claim 1, which comprises performing the step of using the laser beam such that the plated-through holes are produced as blind holes that are bounded by the second metal layer.

15. The method according to claim 1, which comprises performing the step of using the laser beam such that the plated-through holes are produced in the base material as through holes.

16. The method according to claim 1, which comprises using a laser beam to remove regions of the second metal layer that are adjacent the plated-through holes in the base material.

* * * * *